United States Patent [19]

Young et al.

[11] Patent Number: 5,412,349

[45] Date of Patent: May 2, 1995

[54] PLL CLOCK GENERATOR INTEGRATED WITH MICROPROCESSOR

[75] Inventors: Ian Young; Keng L. Wong; Jeffrey K. Greason, all of Portland, Oreg.

[73] Assignee: Intel Corporation, Santa Clara, Calif.

[21] Appl. No.: 861,288

[22] Filed: Mar. 31, 1992

[51] Int. Cl.⁶ .......................... H03L 7/099; H03B 5/02
[52] U.S. Cl. ...................... 331/34; 331/1 A; 331/57
[58] Field of Search .......... 331/2, 1 A, 18, 25, 331/74, 34, 57, 45, 55, 56, 47; 307/269, 271, 480

[56] References Cited

U.S. PATENT DOCUMENTS

| | | | |
|---|---|---|---|
| 3,493,884 | 2/1970 | Kulp | 331/45 X |
| 4,689,581 | 8/1987 | Talbot | 331/1 A |
| 4,847,516 | 7/1989 | Fujita et al. | 307/269 |
| 5,122,679 | 6/1992 | Ishii et al. | 328/155 X |
| 5,272,453 | 12/1993 | Traynor et al. | 331/34 |
| 5,294,894 | 3/1994 | Gebara | 331/25 X |

*Primary Examiner*—David Mis
*Attorney, Agent, or Firm*—Blakely, Sokoloff, Taylor & Zafman

[57] ABSTRACT

A PLL based deskewed clock generator which may be fully integrated on a microprocessor is disclosed. The clock generator has a skew of less than 0.1 ns with peak to peak jitter of 0.3 ns using a 0.8 $\mu$m CMOS technology. The PLL comprises a phase frequency detector, charge pump, loop filter and voltage controlled oscillator from which the internal clock is generated. Since the PLL is on the same chip as the microprocessor, it is difficult to isolate the PLL from the noise generated by the microprocessor core logic and output buffers. Without an external filter, noise from the motherboard also influences the PLL. Power supply noise can cause a direct change in the frequency of the voltage controlled oscillator of the PLL. Circuits which overcome the adverse effects which would be created by such noises are also described.

7 Claims, 11 Drawing Sheets

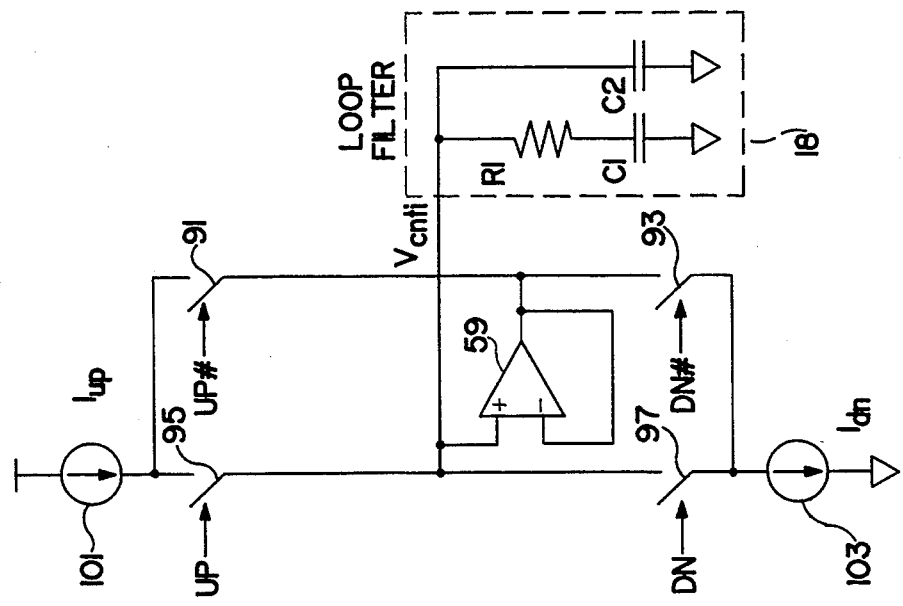
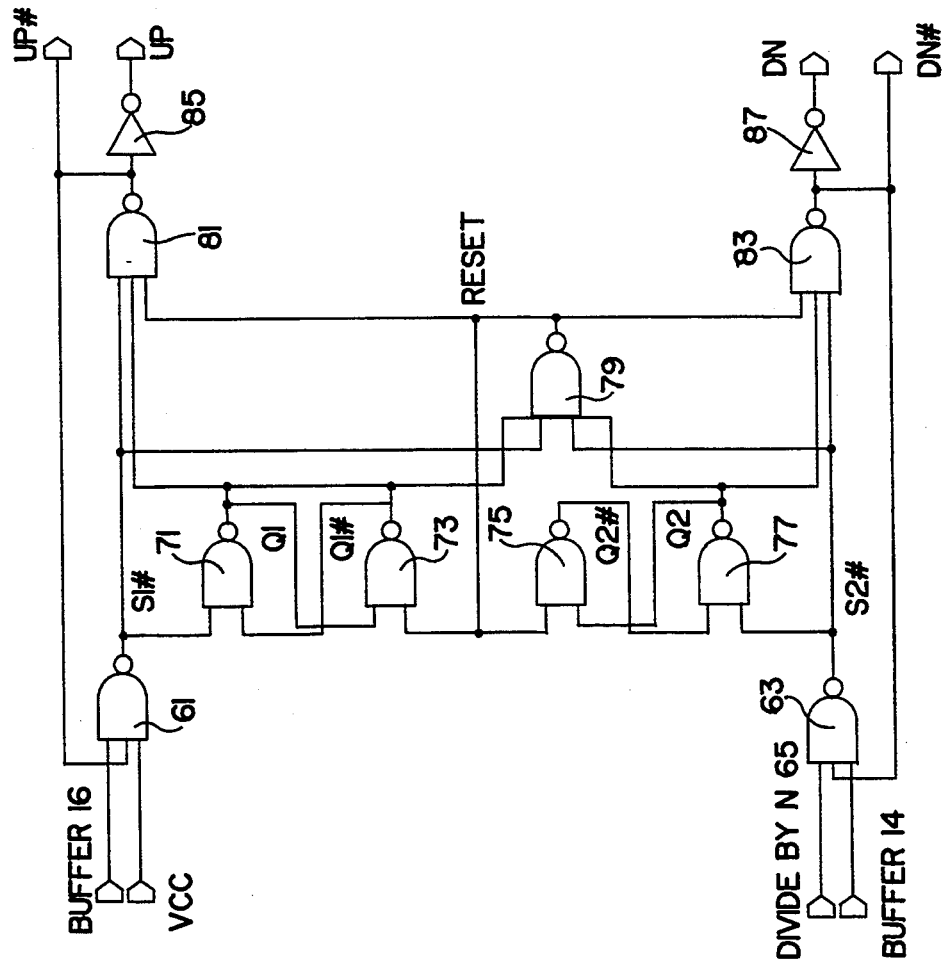
Fig. 3b
Fig. 3a

PLL CLOCK GENERATOR INTEGRATED WITH MICROPROCESSOR

SUMMARY OF THE INVENTION

As microprocessor integrated circuits increase their clock frequency to 50 MHz and higher, it is necessary to eliminate the delay between external and internal clock signals (clock skew) caused by on-chip clock driver delay, where the external clocks are the clock signals generated by a microprocessor system oscillator for use by the components on the microprocessor board and the internal clocks are clock signals generated by a clock driver on the microprocessor integrated circuit for use by the logic circuits on the microprocessor integrated circuit. In addition, clocking the microprocessor internally faster than the clocking of an external bus is an option that is attractive for system integration.

A clock generator based upon a Phase Locked Loop (PLL) is capable of implementing both these capabilities. However, integrating a PLL on a microprocessor chip is difficult because of noise generated by the microprocessor. This invention is directed to a PLL based deskewed clock generator which may be fully integrated on a microprocessor and has a skew of less than 0.1 ns with peak to peak jitter of 0.3 ns using a 0.8 $\mu$m CMOS technology. The PLL comprises a phase frequency detector, charge pump, loop filter and voltage controlled oscillator from which the internal clock is generated. The invention can synthesize an internal clock at a 50% duty cycle at N times the frequency of the external clock (where N ranges from 1 to 16), and eliminate delay between internal and external clocks which improves I/O set-up and hold times.

Since the PLL is on the same chip as the microprocessor, it is difficult to isolate the PLL from the noise generated by the microprocessor core logic and output buffers. Without an external filter, noise from the motherboard also influences the PLL. Power supply noise can cause a direct change in the frequency of the voltage controlled oscillator of the PLL. The frequency error causes a phase error between the internal and external clock. The present invention incorporates circuits which overcome the adverse effects which would be created by such noises.

BRIEF DESCRIPTION OF THE DRAWINGS

FIG. 2f-1/2f-2 is a detailed schematic diagram of an implementation of ring oscillator having five delay stages 37.

FIG. 3a is a circuit diagram of phase frequency detector 10.

FIG. 3b is a circuit diagram of charge pump 17 and loop filter 18.

DETAILED DESCRIPTION OF THE INVENTION

Figure 1:
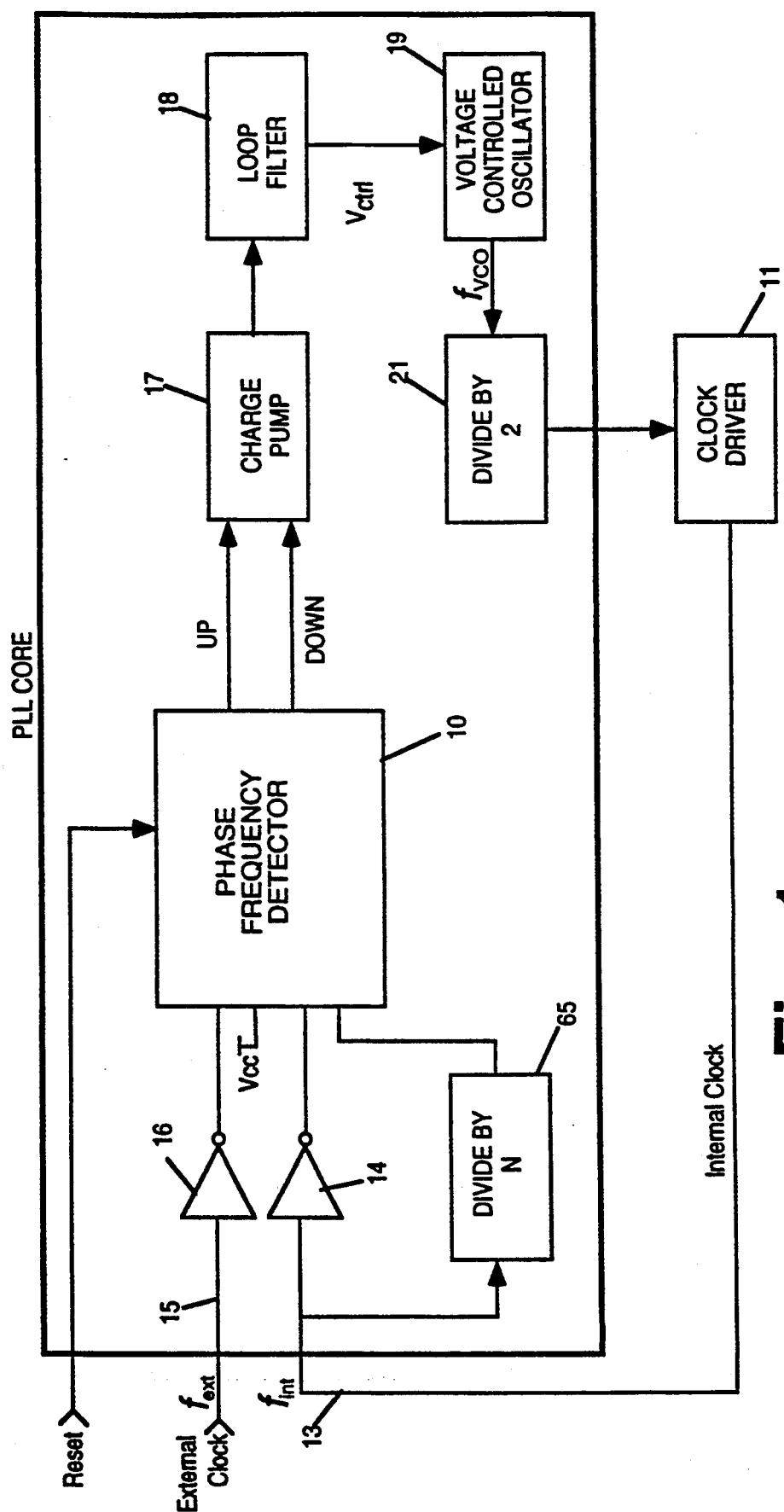
FIG. 1 is a block overview diagram of the invented PLL clock generator.

A block diagram of a deskewed clock generator according to the present invention is shown in FIG. 1. The input offset phase error of a phase frequency detector (PFD) 10 determines the skew between an internal clock signal 13 generated by a clock driver 11 and an external clock signal 15. Clock driver 11 is designed to drive a large capacitive load (up to several hundred picofarads or more) to provide initial timing (one or two phase) for the microprocessor. The external clock signal is typically generated at the system level with a crystal oscillator and routed to the microprocessor and other components forming a microcomputer. The two clock signal inputs are input to the PFD through buffers 14 and 16 which are needed so that the external clock signal input buffer delay can be matched. Buffers 14 and 16 are TTL level or CMOS level input buffers which are accurately matched with respect to their trip point and delay (i.e., trip points within 100 mV and delay within 0.05 ns.) The phase error detected by PFD 10 is input to a charge pump 17 as an UP or DOWN pulse width having a duration equal to the amount of time the internal clock leads or lags the external clock. Charge pump 17 delivers a packet of charge (+ or −,) equal to the UP or DOWN pulse width, to loop filter 18. Loop filter 18 stabilizes the PLL even with component variation. The stabilized signal is then input to a voltage controlled oscillator (VCO) 19 followed by a divide by two circuit 21 that generates a 50% duty cycle clock waveform for the microprocessor. Divide by two circuit 21 operates at the same frequency as that generated by VCO 19 with a delay less than 1 ns relative to the internal clock edge.

Figure 2A:
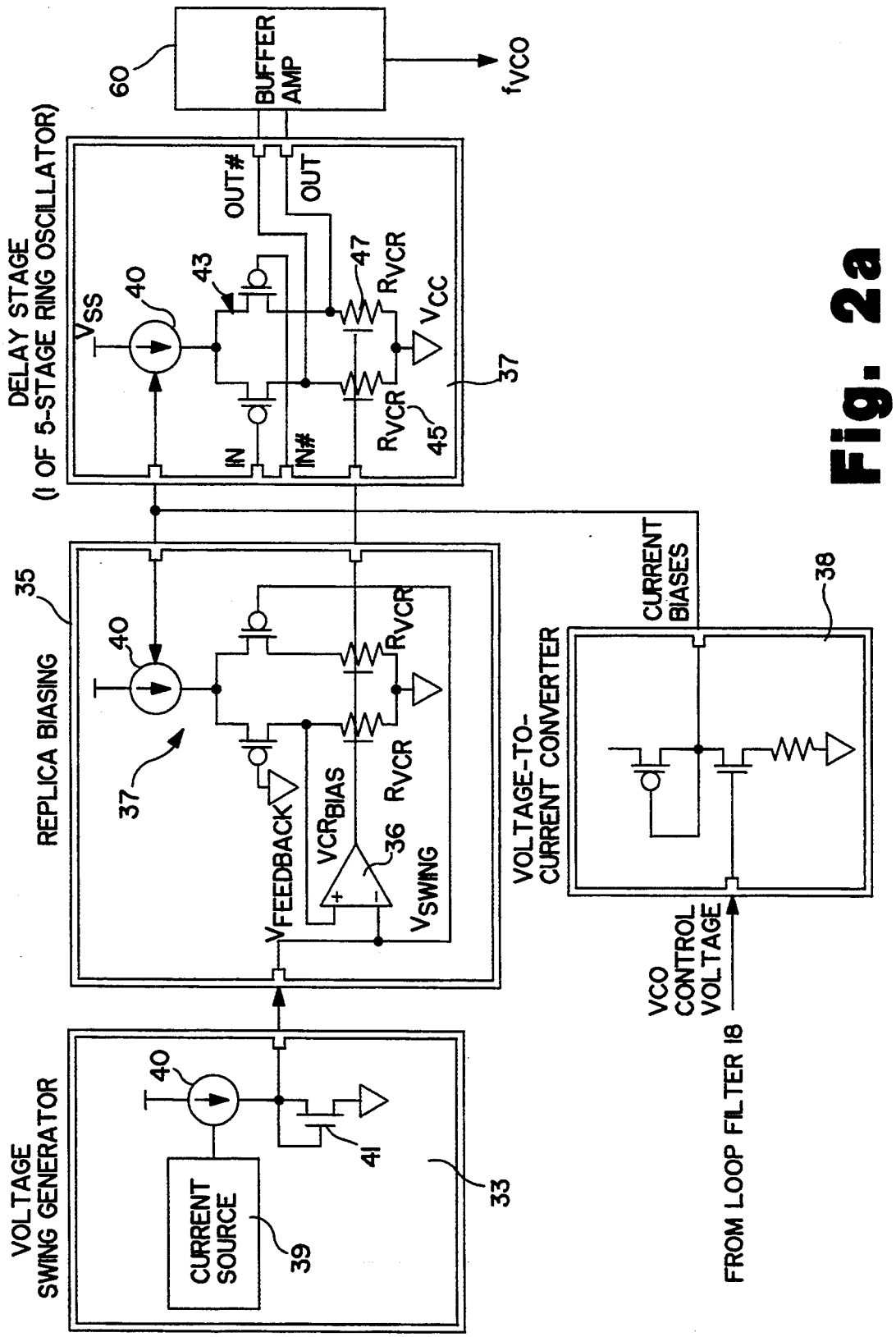
FIG. 2a is a block diagram of differential voltage controlled oscillator 19.

FIG. 2a shows the key circuits used to implement VCO 19. The VCO is based on a five stage ring oscillator where each stage is a differential current controlled delay cell 37. Delay through each cell 37 is a function of the tail current through P-channel differential source coupled pair 43, the differential voltage swing between OUT and OUT#, and the capacitive load on OUT and OUT#.

The voltage swing in the delay cell is held constant and independent of supply voltage utilizing the following circuit elements: voltage controlled resistors (VCR) 45 and 47 in delay stage 37 (designated $R_{vcr}$ in FIG. 2a), a power supply insensitive voltage swing reference generator 33, a feedback replica biasing circuit 35 and a voltage to current converter 38.

Voltage swing reference generator (VREF) 33 as shown in FIG. 2a is a self-biasing, supply independent MOSFET current source 39, based on the mobility difference between two N-MOSFETs with different current density. This circuit uses cascoding for P-channel current mirrors 40 to enhance their output impedance. This current source 39 is mirrored into an N-channel diode connected MOSFET 41 to generate a voltage bias that tracks with the N-MOSFET based VCR's ($R_{vcr}$ 45 and 47) process variation.

The cascoded current source 39 acts in a manner well known in the art (for example, P. R. Gray, R. G. Meyer, *Analysis and Design of Analog Integrated Circuits*, second edition, p. 711) to increase the output impedance of the VCC referenced current mirror 40. This output impedance determines the fundamental limit on the VCC-noise rejection of the circuit. Current source 39 as described above has an output impedance of 1 megaohm and a supply sensitivity of 0.6%/Volt.

Figure 2B:
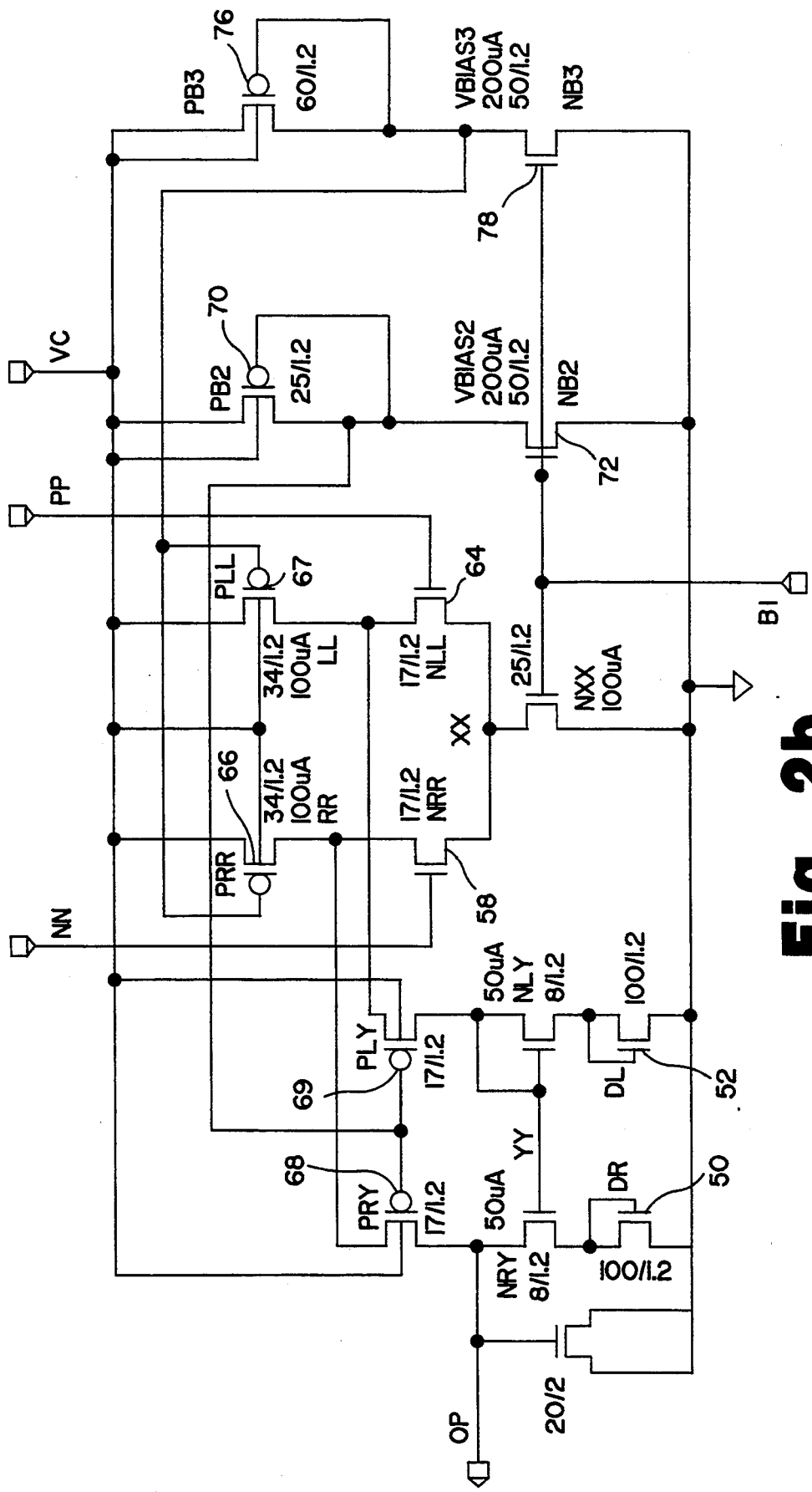
FIG. 2b is a circuit diagram of op-amp 36.

The replica biasing circuit 35 uses an op-amp 36 and a copy of the delay cell 37 to generate the appropriate bias to $R_{vcr}$ 45 and 47. Op-amp 36 is a differential folded-cascode amplifier whose details are shown in FIG. 2b. The circuit shown in FIG. 2b provides an optimum combination of high gain (at least 30 dB) and high bandwidth (at least 200 MHz). This circuit is differs from typical, prior art folded-cascode amplifier designs in the addition of diode connected MOSFET devices 50 and 52 to the sources of the N-MOSFET devices 54 and 56 forming a current mirror differential to a single ended converter. Devices 50 and 52 operate as follows. Since the output of op-amp 36 goes to the gate of N-MOSFET 55 (see FIG. 2c) whose drain feeds back to the amplifier input, there is effectively one more stage of gain in the feedback path. When the output voltage is within 100 mV–200 mV of the threshold voltage of the N-MOSFET which the amplifier output connects to, the gain of this device stage becomes much higher. This produces gain around the feedback loop which is so high that there will be oscillation occurring in the loop. This oscillation creates a problem which may prevent the correct operation of replica biasing circuit 35 which therefore must be suppressed. To correct this problem, the two diode connected N-MOSFETs are used to limit the output from swinging down to this critical voltage. Effectively, the output swing is shifted up by approximately one N-MOSFET threshold voltage.

Devices 58 and 64 are the differential input devices to the amplifier. Devices 66 and 67, 68 and 69 form the cascoded circuitry. Devices 54 and 56 form the output differential to the single ended converter. Devices 70 and 72, and 76 and 78 form the biasing circuitry to set-up the bias voltages to the P-channel folded-cascode devices.

The delay cell 37 is based on a P-MOSFET source coupled pair 43, with VCR load elements 45 and 47. The N well containing the P-MOSFET devices is biased at a voltage referenced to VSS. This eliminates noise coupling from the power supply (not shown) to the signal nodes OUT and OUT# in each stage. The use of P-MOSFET devices makes the signals from OUT and OUT# referenced to VSS, eliminating frequency shifts due to nonlinear capacitances to VCC. Tail current sources are cascoded for high impedance to VCC, thus providing maximum isolation of any VCC noise coupling into the signal path.

The VCR ($R_{VCR}$ 45 and $R_{VCR}$ 47) is a key component in the delay cell. What is required is an element which is suitable as a load resistor for source/drain voltages between 0 volt and 0.8 volt (VREF) and having the widest possible range of resistance to maximize the VCO frequency range of operation. As shown in FIG. 2b, each VCR uses a combination of three N-MOSFETs 51, 53 and 55 to provide a more linear Id versus Vd characteristic than a single MOSFET. This VCR circuit configuration is able to achieve higher dynamic range than prior art VCRs such as that described by G. Mood, M. Zaghloul, R. Newcomb, "An Enhancement-Mode Voltage-Controlled Linear Resistor with Large Dynamic Range," *IEEE Trans. Circuits & Systems*, October 1990, p.1284. Further details regarding the VCR are provided in copending application Ser. No. 831,697, filed Feb. 9, 1992. (P937)

The delay cell shown in FIG. 2a improves the power supply noise rejection of the VCO by six times to 0.7%/V compared to 4.5%/V available in the prior art such as taught by B. Kim, P. Gray, "A 30 MHz Hybrid Analog/Digital Clock Recovery Circuit in 2 μm CMOS," *IEEE JSCC.*, December 1990, pp. 1385–1394. Table I summarizes the other VCO characteristics achieved by use of the VCO described with reference to FIG. 2a.

TABLE I

| VCO Characteristics | |
|---|---|
| Frequency Range | 10 MHz to 220 MHz |
| Sensitivity Variation | 43 to 77 MHz/V |
| | (−10° C. to 120° C.) |
| Supply Sensitivity (free running) | 0.7%/V |
| Temperature Sensitivity (free running) | 4700 ppm/°C. |

The signal $f_{vco}$ provided to divide by 2 circuit 21 is generated by amplifying the differential signal from the ring oscillator converting the small differential signal in the VCO to a high speed clock signal using amplifier 60. Amplifier 60 is implemented as a differential amplifier with P-channel input devices for producing a differential to single ended conversion with a high signal amplifier. Since the VCO signal is referenced to VSS (0V), the P channel input devices enable the amplifier to have high differential gain and small common mode gain for such a signal.

Voltage to current converter 38 inputs the VCO control voltage from loop filter 18 and converts it to a current bias provided to current source 40 of replica biasing circuit 35 and the ring oscillator.

Figure 2C:
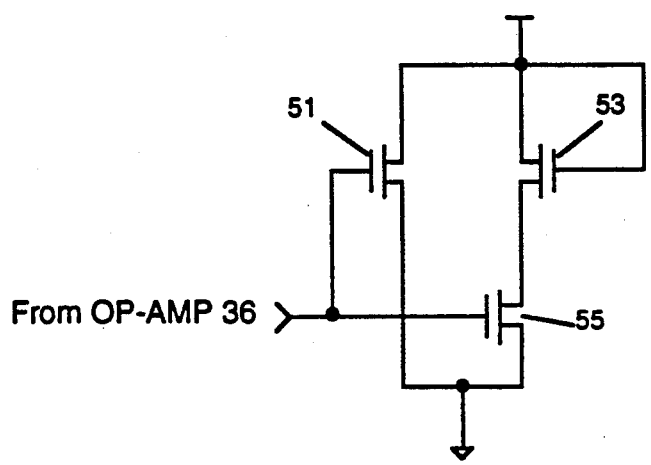
FIG. 2c is a circuit diagram of a voltage controlled resistor used by voltage controlled oscillator 19.
Figure 2D:
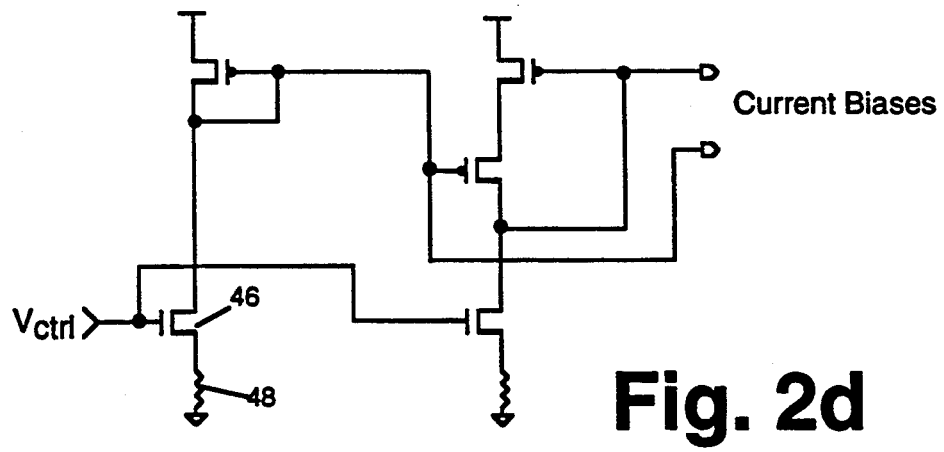
FIG. 2d is a circuit diagram of voltage to current converter 38.

The voltage to current converter 38 may be implemented as a simple transconductance element as shown in FIG. 2c comprising an N-channel source follower 46 with a large source resistor 48. An N-well is used to form the resistor. In order to maintain the highest possible power supply rejection, the current mirror is cascoded.

Qualitatively, the N-channel source follower 46 can be considered an ideal source follower, with the source voltage always Vtn below the gate voltage. Since there is a fixed linear resistor 48 between the source and ground, the current will be: $I = (V_G − V_{TH})/R$.

Figure 2E:
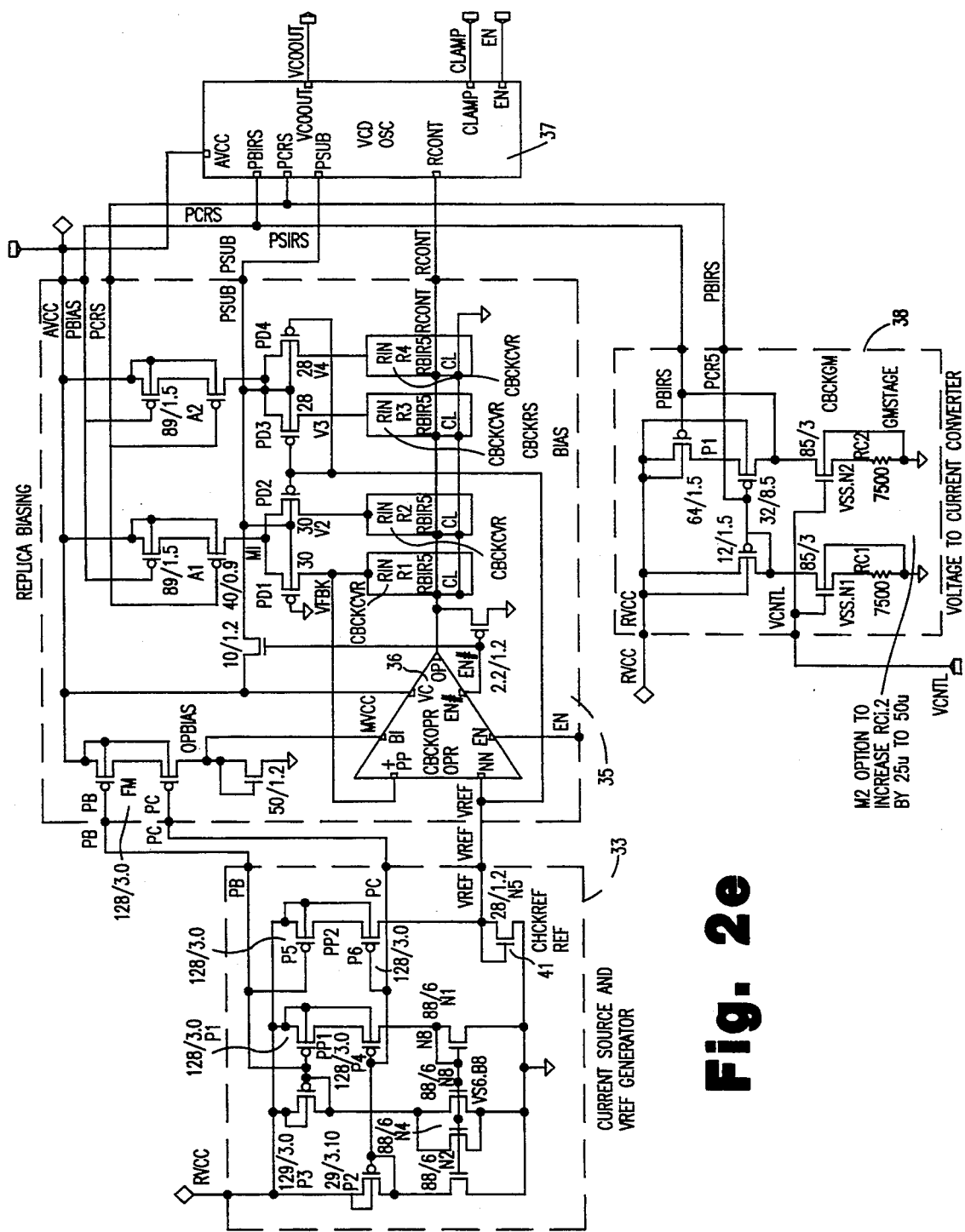
FIG. 2e is a detailed schematic diagram of an implementation of voltage swing generator 33, replica biasing 35 and voltage to current converter 38.
Figures 1, 2F:
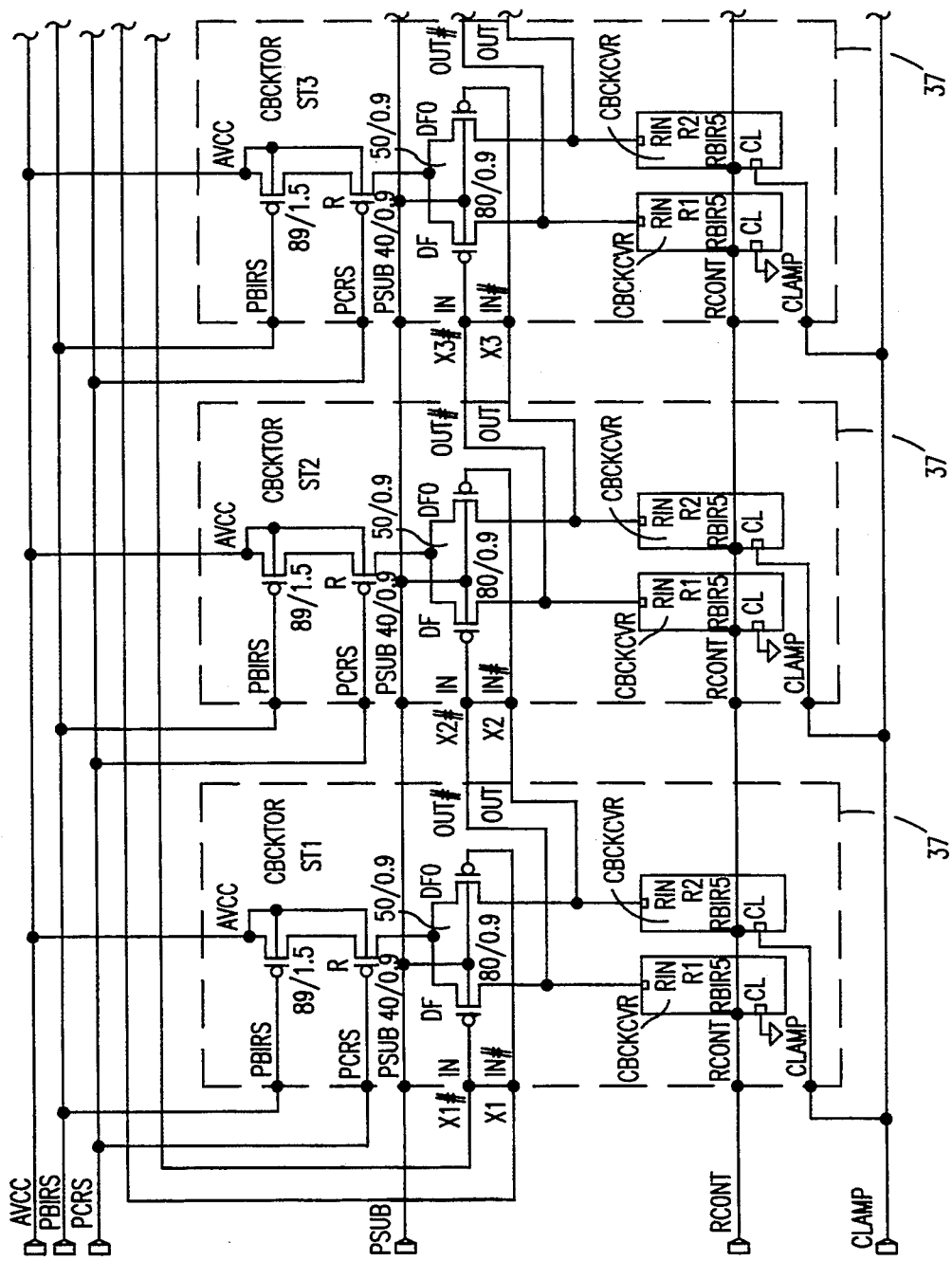
Figures 2, 2F:
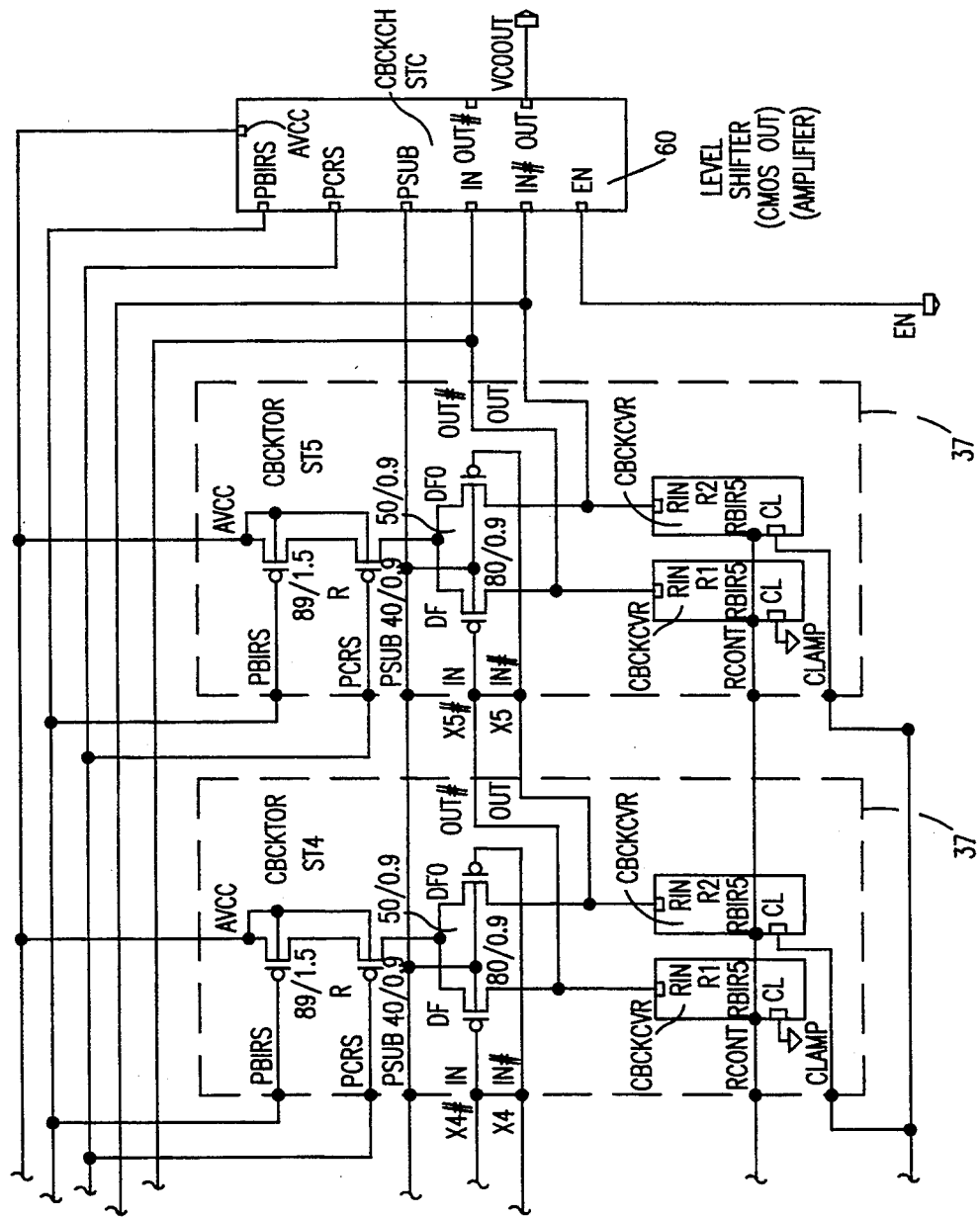

FIG. 2e is a complete schematic of a particular implementation of a current source and VREF generator which may be used as voltage swing generator 33, as well as a circuit for replica biasing 35 and for voltage to current converter 38. The ring oscillator 37 is represented as a single block 37. A suitable ring oscillator with five stages which may be used in conjunction with the circuit of FIG. 2e is shown in FIG. 2f-1/2f2.

Details of PFD 10 are shown in FIG. 3a and charge pump circuit 17 and loop filter 18 are shown in FIG. 3b. The PFD shown in FIG. 3a utilizes a gate 61 having external clock 15 from buffer 16 as one input, VCC as a second input and a feedback from an output of the PFD as a third input, and a second gate 63 having internal clock 13 from buffer 14 as one input, the output of divide by N or pulse swallowing circuit 65 as a second input and a feedback from a second output of the PFD as a third input. NAND gates 71, 73, 75, 77, 79, 81 and 83 are used as a sequential phase-frequency detector with inverters 85 and 87 inverting the outputs of gates 81 and 83 respectively to generate the UP and DOWN pulse widths having a duration equal to the amount of time the internal clock leads or lags the external clock. The generated UP and DOWN pulse widths are shown as the signals UP, UP#, DN and DN# in FIGS. 3a and 3b.

The output of gates 81 and 83 (UP# and DN#) and their respective inversions (UP and DN) are input to switches 91, 93, 95 and 97 respectively of charge pump 17 as shown in FIG. 3b. These switches are implemented as parallel P-channel/N-channel devices which determine how long the current from sources 101 and 103 are connected to $V_{cntl}$. That is charge pump 13 uses the inputs UP, UP#, DN and DN# to generate a voltage $V_{cntl}$ which is created by op amp 59 and the other components as follows. When UP is high, the P/N switch closes and current source 101 is connected to $V_{cntl}$. Since $V_{cntl}$ has a loop filter connected to it comprising a resistor and two capacitors, the time in which UP is high determines how much current charge is delivered into the filter which, in turn, determines how much increase in voltage $V_{cntl}$ experiences. Similarly, when DN is high, current source 102 causes $V_{cntl}$ to decrease. The op amp 59 in the charge pump is designed to suppress charge sharing as described in M. Johnson, E. Hudson, "A Variable Delay Line PLL For CPU-Coprocessor Synchronization," *IEEE JSSC.*, October 1988, pp. 1218–1223. These circuits provide a transfer function of input phase error to output charge per clock cycle. This transfer characteristic must be controlled over supply, temperature, and process variations since it determines the clock skew. Current sources 101 and 103 may be implemented by use of N channel current mirror 102 and P channel current mirrors referenced to a circuit like the current source described above formed by the difference in N channel current density in two N-MOSFETs, or simply, with a resistor and a MOSFET diode connected between the power supplies VCC and VSS.

$V_{cntl}$ is input to loop filter 18 as shown in FIG. 3b. The details of loop filter 18 are shown in FIG. 3b, with 2 poles and one zero, which minimize the change in PLL stability as the loop gain changes under varying conditions of the circuit. The PLL is stable with low jitter, even when the pulse swallowing circuit (Divide by N 65) at the PFD input is programmed to mask every second cycle, making the internal clock run at N times the external clock frequency. Divide by N circuit 65 is a circuit which defines the ratio of $f_{int}$ to $f_{ext}$ where N is the multiplier. For example, if $f_{int}$ is to be 3 times $f_{ext}$, then N equals 3.

Table II shows the measured performance of the clock generator when functioning with a microprocessor running at 50 MHz. To characterize the PLL rejection of power supply noise, a step response test is used since the microprocessor can generate a change in the supply from one cycle to the next.

TABLE II

| PLL Measured Data at 5 V and 25° C. | |
|---|---|
| Peak-to-Peak Jitter | 0.30 ns |
| Phase Error (skew) | ±0.10 ns @ 50 MHz |
| Phase Error (skew) over clock frequency range (10 to 100 MHz) | −0.3 to +0.1 ns |
| PLL Lock-In Time | 75 µs |

TABLE II-continued

| PLL Measured Data at 5 V and 25° C. | |
|---|---|
| PLL Power Dissipation | 16 mW |
| Silicon Area of PLL (without clock driver) | 500 mils² (0,8 µm CMOS) |

Figure 4A:
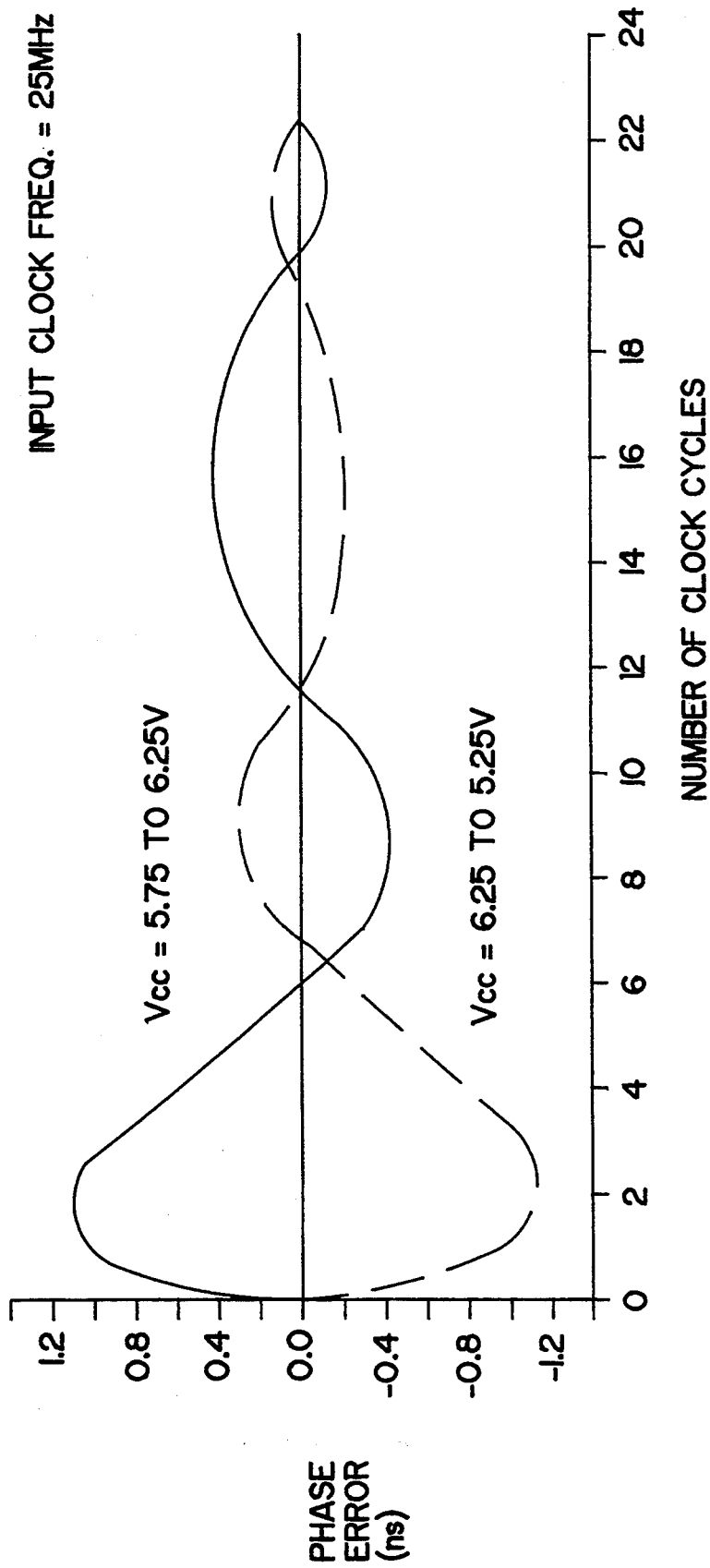
FIG. 4a is a graph showing phase error verses clock cycles for power supply step response when using the present invention.
Figure 4B:
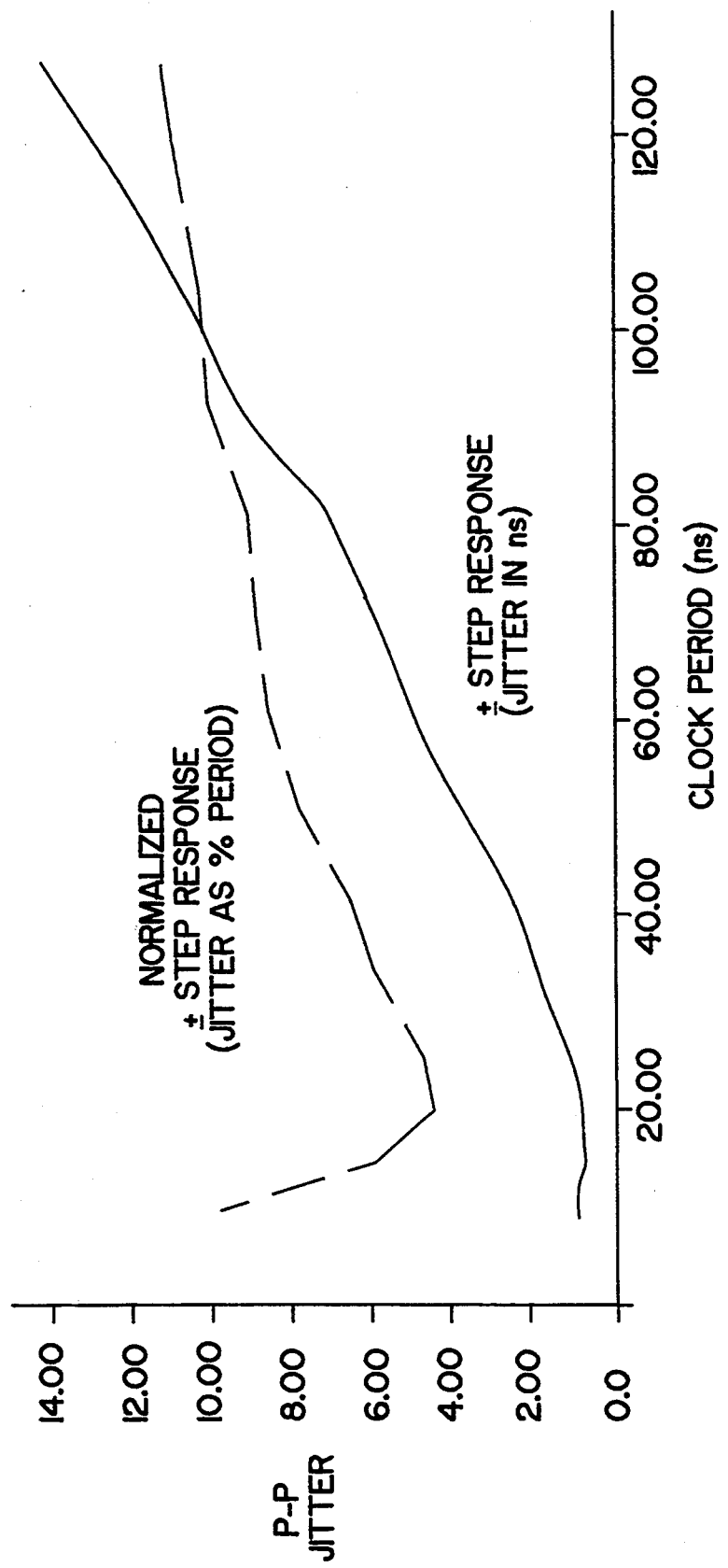
FIG. 4b is a graph showing jitter verses clock period for power supply rejection test when using the present invention.

FIG. 4a shows the transient phase error response of the PLL to a positive or negative 500 mV step on the VCC level (5.75 V to 6.25 V for worst case). The peak-to-peak jitter scales with the size of the step. The same step response over the range of input clock periods is shown in FIG. 4b.

Figure 5:
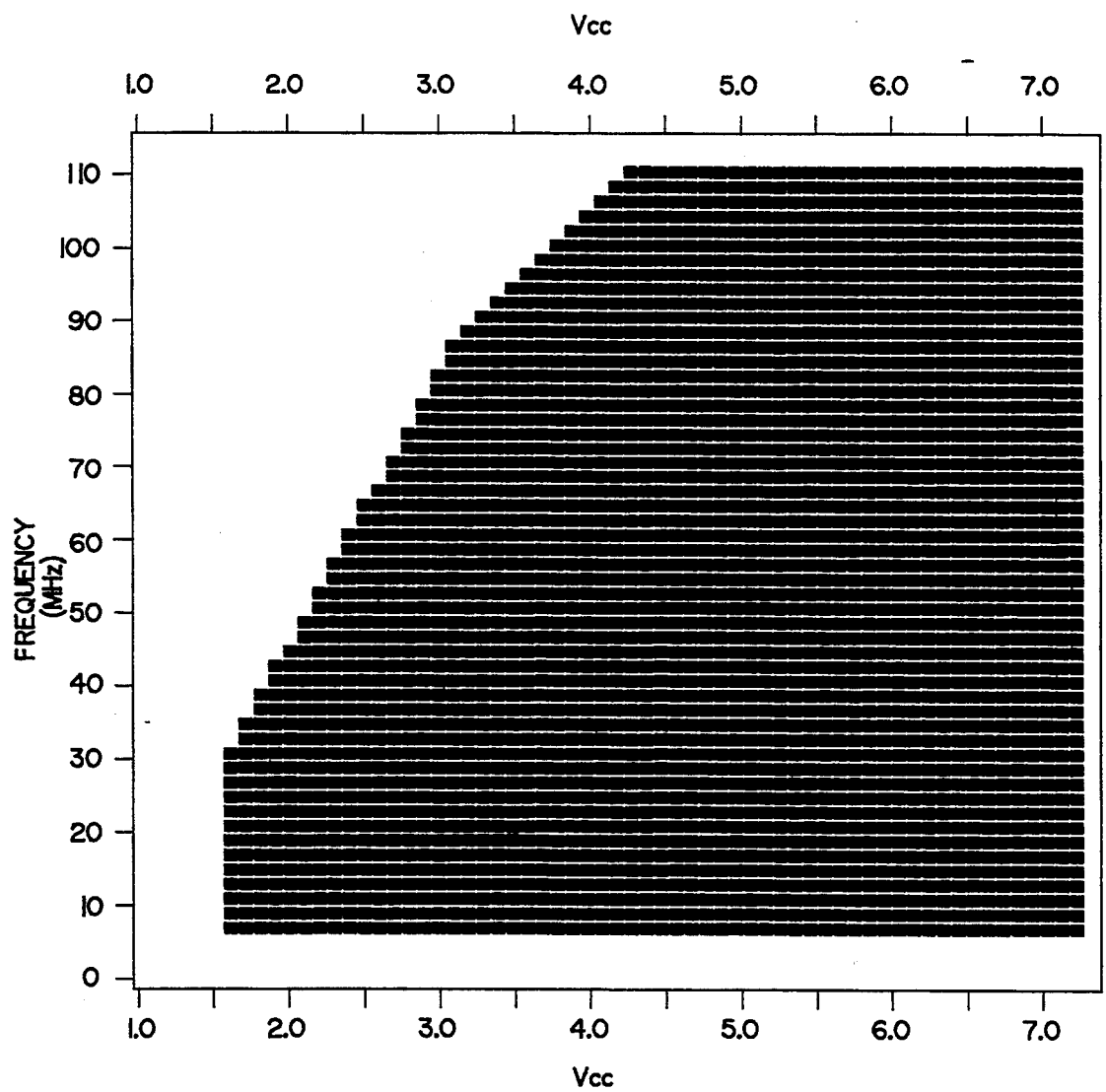
FIG. 5 is a Schmoo plot of the invented PLL clock generator.

The measured schmoo diagram of the PLL clock generator functionality frequency versus supply voltage is shown in FIG. 5. The operation of the PLL with an input frequency as low as 5 MHz and as high as 110 MHz is possible. Since this PLL implementation provides a 50% duty cycle clock regardless of input duty cycle, the PLL's operating timing precision is as high as 220 MHz.

By use of the above-described invention, a PLL analog circuit can be integrated into a large microprocessor chip and provide the deskewing accuracy required for clock frequency synthesis up to more than 100 MHz and also to synthesize an internal clock at multiples of an external clock.

We claim:

1. A phase locked loop deskewed clock generator for generating a clock signal for internal use by a microprocessor from an external clock source which generates an external clock signal wherein said clock generator forms an integrated circuit with said microprocessor, said clock generator comprising:
   a) clock driver means for generating an internal clock signal for internal use by said microprocessor;
   b) phase frequency detector means for detecting a phase difference between said external clock signal and said internal clock signal and generating a phase error signal with a pulse width having a duration equal to an amount of time the internal clock signal leads or lags the external clock signal;
   c) charge pump means for receiving said phase error signal and creating a control voltage change caused by a packet of charge equal to the amount of time the internal clock signal leads or lags the external clock signal;
   d) loop filter means for receiving and stabilizing the control voltage generated by the charge pump;
   e) voltage controlled oscillator means for receiving the stabilized control voltage and generating an intermediate clock signal having a predetermined frequency, said voltage controlled oscillator including:
      i) a voltage to current converter means coupled to said loop filter means for converting said stabilized control voltage to a first current bias signal;
      ii) replica biasing means coupled to said voltage to current converter means for generating a second current bias signal;
      iii) delay stage means coupled to said voltage to current converter means and said replica biasing means for generating a differential signal representing differences between said first current bias signal and said second current bias signal;
      iv) voltage swing reference generator means coupled to said replica biasing means for generating a voltage bias signal which tracks with process variations in said replica biasing means and said delay stage means;

v) amplifier means coupled to said delay stage means for converting the differential signal generated by said delay stage means to a large swing, high frequency clock signal;

f) means for generating a clock driver control signal as a function of said intermediate clock signal for controlling said clock driver.

2. The clock generator defined by claim 1 wherein said delay stage means comprises a five stage ring oscillator.

3. The clock generator defined by claim 2 wherein each stage of said five stage ring oscillator is a delay cell comprising:

(a) a current mirror coupled to said voltage to current converter means;

(b) a P-channel source coupled pair of MOSFET devices coupled to said current mirror, each said MOSFET device having a gate, a source and a drain;

(c) a pair of voltage controlled resistors coupled to said P-channel source coupled pair and said replica biasing means, wherein the gate of each said MOSFET device is coupled to the drain of a corresponding MOSFET device in an adjacent delay cell.

4. The clock generator defined by claim 1 wherein said clock driver control signal generating means is a divide by 2 circuit.

5. The clock generator defined by claim 1 wherein said phase frequency detector means comprises:

(a) first and second buffer means respectively coupled to said external clock for buffering said external clock signal and said internal clock signal such that the frequency and phase of said external clock signal and said internal clock signal are equal;

(b) a first plurality of logic gates coupled to said first buffer means adapted to generate an UP pulse width;

(c) a second plurality of logic gates coupled to said second buffer means adapted to generate a DOWN pulse width.

6. The clock generator defined by claim 5 wherein said first and second buffer means each comprise a pair of matched input buffers, having its trip points within 100 mV and delay within 0.05 ns.

7. The clock generator defined by claim 1 further comprising a pulse swallowing circuit coupled between said clock driver means and said phase frequency detector means, said pulse swallowing circuit adapted to eliminate each of a predetermined number of pulses generated by said clock driver means, whereby said internal clock signal is generated synchronous with said external clock signal at a frequency equal to a predetermined multiple of the frequency of said external clock signal.

* * * * *